(12) United States Patent
Cha et al.

(10) Patent No.: US 12,308,689 B2
(45) Date of Patent: May 20, 2025

(54) BATTERY MANAGEMENT SYSTEM, BATTERY MANAGEMENT METHOD, BATTERY PACK AND ELECTRIC VEHICLE

(71) Applicant: LG Energy Solution, Ltd., Seoul (KR)

(72) Inventors: A-Ming Cha, Daejeon (KR); Yoon-Jung Bae, Daejeon (KR); Hee-Seok Jeong, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 487 days.

(21) Appl. No.: 17/783,066

(22) PCT Filed: Jul. 19, 2021

(86) PCT No.: PCT/KR2021/009285
§ 371 (c)(1),
(2) Date: Jun. 7, 2022

(87) PCT Pub. No.: WO2022/019595
PCT Pub. Date: Jan. 27, 2022

(65) Prior Publication Data
US 2023/0035092 A1    Feb. 2, 2023

(30) Foreign Application Priority Data

Jul. 20, 2020 (KR) .......................... 10-2020-0089755

(51) Int. Cl.
*H02J 7/00* (2006.01)
*B60L 58/12* (2019.01)
(Continued)

(52) U.S. Cl.
CPC ........ *H02J 7/007184* (2020.01); *B60L 58/12* (2019.02); *G01R 31/3648* (2013.01);
(Continued)

(58) Field of Classification Search
CPC ............ H02J 7/007184; H02J 7/00714; H02J 7/00308; H02J 7/0071; H02J 7/00712;
(Continued)

(56) References Cited

U.S. PATENT DOCUMENTS 10,063,072 B2 * 8/2018  Tanaka .............. H01M 10/0525
11,460,506 B2 * 10/2022 Kim ...................... G01R 31/382
(Continued)

FOREIGN PATENT DOCUMENTS

CN         105723559 A     6/2016
EP           3076478 A1    10/2016
(Continued)

OTHER PUBLICATIONS

International Search Report for Application No. PCT/KR2021/009285 mailed Oct. 26, 2021, pp. 1-3.

*Primary Examiner* — M Baye Diao
(74) *Attorney, Agent, or Firm* — Bryan Cave Leighton Paisner LLP (57) ABSTRACT

A battery management system includes a voltage sensor to generate a voltage signal indicating a voltage of a battery, a current sensor to generate a current signal indicating a current flowing through the battery, and a control unit to record a voltage history and a current history of the battery based on the voltage signal and the current signal at a predetermined time interval during constant current charging of the battery. The control unit determines a differential capacity curve indicating a correlation between the voltage of the battery and a differential capacity in a reference voltage range. The control unit performs a first protection operation for the battery by comparing a first characteristic
(Continued)

voltage of a main feature point with a reference voltage when the main feature point is detected from the differential capacity curve.

12 Claims, 5 Drawing Sheets (51) Int. Cl.
*G01R 31/36* (2020.01)
*H01M 10/42* (2006.01)
*H01M 10/44* (2006.01)
*H01M 10/48* (2006.01)

(52) U.S. Cl.
CPC ....... *H01M 10/4257* (2013.01); *H01M 10/44* (2013.01); *H01M 10/48* (2013.01); *H02J 7/00714* (2020.01); *B60Y 2200/91* (2013.01); *H01M 2010/4271* (2013.01)

(58) Field of Classification Search
CPC .... B60L 58/12; B60L 53/62; B60L 2240/529; B60L 2240/547; B60L 2240/549; B60L 3/0046; B60L 3/12; B60L 58/16; B60L 58/10; G01R 31/3648; G01R 31/382; G01R 31/007; G01R 31/36; H01M 10/4257; H01M 10/44; H01M 10/48; H01M 2010/4271; H01M 2220/20; H01M 10/42; H01M 10/425; B60Y 2200/91; Y02E 60/10; Y02T 10/70

USPC ......................................................... 320/132
See application file for complete search history.

(56) References Cited

U.S. PATENT DOCUMENTS

| | | | |
|---|---|---|---|
| 12,007,449 B2* | 6/2024 | Cha | ..................... H02J 7/00712 |
| 2010/0264929 A1 | 10/2010 | Ugaji et al. | |
| 2012/0116701 A1 | 5/2012 | Yuasa | |
| 2015/0123621 A1 | 5/2015 | Kim et al. | |
| 2016/0254687 A1 | 9/2016 | Tanaka et al. | |
| 2017/0212170 A1 | 7/2017 | Torai et al. | |
| 2019/0168617 A1 | 6/2019 | Ling et al. | |
| 2019/0334355 A1 | 10/2019 | Kim et al. | |
| 2020/0182942 A1* | 6/2020 | Lee | ........................ H01M 10/44 |
| 2021/0046844 A1 | 2/2021 | Bae et al. | |

FOREIGN PATENT DOCUMENTS

| | | | | |
|---|---|---|---|---|
| JP | 5163466 B2 | 3/2013 | | |
| JP | 2013068458 A | 4/2013 | | |
| JP | 5372208 B2 | 12/2013 | | |
| JP | 5492291 B2 | 5/2014 | | |
| JP | 6380417 B2 | 8/2018 | | |
| JP | 2018206612 A | 12/2018 | | |
| JP | 6500789 B2 | 4/2019 | | |
| JP | 2019056595 A | * | 4/2019 | ............ G01R 31/36 |
| JP | 2019158597 A | 9/2019 | | |
| KR | 101494156 B1 | 2/2015 | | |
| KR | 20180086591 A | 8/2018 | | |
| KR | 20190118529 A | 10/2019 | | |

* cited by examiner

BATTERY MANAGEMENT SYSTEM, BATTERY MANAGEMENT METHOD, BATTERY PACK AND ELECTRIC VEHICLE

CROSS-REFERENCE TO RELATED APPLICATIONS

The present application is a national phase entry under 35 U.S.C. § 371 of International Application No. PCT/KR2021/009285 filed Jul. 19, 2021, which claims priority from Korean Patent Application No. 10-2020-0089755 filed Jul. 20, 2020, all of which are incorporated herein by reference.

TECHNICAL FIELD

The present disclosure relates to battery protection technology.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be charged and discharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

During charging or discharging of the battery, polarization occurs in the battery, and the polarization causes an overvoltage of the battery. The polarization relies on the resistance components (for example, Ohm resistance, charge transfer resistance, diffusion resistance) that gradually increase as the battery degrades. Accordingly, as the current rate during charging/discharging is higher, as the temperature of the battery is lower, and as the degree of degradation of the battery is higher, the polarization is severer, and as a result, the magnitude of overvoltage occurring in the battery is higher as well known. When the battery is used in a potential polarization state, the battery rapidly degrades.

SUMMARY

Technical Problem

The inventors found that phase change reaction occurring during charging of the battery greatly relies on polarization having a positive correlation with overvoltage of the battery.

The present disclosure is designed to solve the above-described problem, and therefore the present disclosure is directed to providing a battery management system, a battery management method, a battery pack and an electric vehicle, which determines a differential capacity curve over a preset voltage range in which a single phase change reaction occurs during charging of a battery, and determines the polarization level using the feature point detection result with respect to the differential capacity curve.

The present disclosure is further directed to providing a battery management system, a battery management method, a battery pack and an electric vehicle, which performs different protection operations for the battery using the polarization level determined from the feature point detection result with respect to the differential capacity curve.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A battery management system according to an aspect of the present disclosure includes a voltage sensor configured to generate a voltage signal indicating a voltage of a battery, a current sensor configured to generate a current signal indicating a current flowing through the battery, and a control unit configured to record a voltage history and a current history of the battery based on the voltage signal and the current signal at a predetermined time interval during constant current charging of the battery. The control unit is configured to determine a differential capacity curve indicating a correlation between the voltage of the battery and a differential capacity in a reference voltage range based on the voltage history and the current history. The control unit is configured to detect a main feature point of the differential capacity curve and, in a first protection operation for the battery, compare a first characteristic voltage of a main feature point with a reference voltage of the main feature point with a reference voltage.

The main feature point may be a first maximum point of the differential capacity curve during the constant current charging of the battery.

The control unit may be configured to set, in the first protection operation, a decreased cut-off voltage of the constant current charging, wherein the cut-off voltage is decreased by a compensation voltage corresponding to a voltage difference between the first characteristic voltage and the reference voltage and a lower limit of the cut-off voltage to an upper limit voltage of the reference voltage range.

The control unit may be configured to set, in the first protection operation, a decreased reference current of the constant current charging, wherein the reference current is decreased by a first compensation current corresponding to a voltage difference between the first characteristic voltage and the reference voltage.

The control unit may be configured to detect a second feature point from the different capacity curve, the second feature point having a second characteristic voltage that is larger than the first characteristic voltage, and perform a second protection operation for the battery in response to detection of the second feature point.

The control unit is configured to additionally decrease, in the second protection operation, the reference current.

The control unit may be configured to stop the constant current charging in response to a feature point not being detected from the differential capacity curve.

The control unit may be configured to determine the reference voltage range based on a maximum capacity of the battery.

A battery pack according to another aspect of the present disclosure includes the battery management system.

An electric vehicle according to still another aspect of the present disclosure includes the battery pack.

A battery management method according to yet another aspect of the present disclosure may be performed at a predetermined time interval during constant current charging of a battery. The battery management method includes recording a voltage history and a current history of the battery based on a voltage signal indicating a voltage of the battery and a current signal indicating a current flowing through the battery, determining a differential capacity curve indicating a correlation between the voltage of the battery and a differential capacity in a reference voltage range based on the voltage history and the current history, detecting a main feature point of the differential capacity curve, and in a first protection operation for the battery, comparing a first characteristic voltage of the main feature point with a reference voltage.

The battery management method may further include detecting a second feature point of the differential capacity curve, the second feature point having a second characteristic voltage that is larger than the first characteristic voltage; and performing a second protection operation for the battery in response to detecting the second feature point.

Advantageous Effects

According to at least one of the embodiments of the present disclosure, after determining a differential capacity curve over a preset voltage range in which a single phase change reaction occurs during charging of a battery, the polarization level may be determined using the feature point detection result with respect to the differential capacity curve.

Additionally, according to at least one of the embodiments of the present disclosure, different protection operations for the battery are performed using the polarization level determined from the feature point detection result with respect to the differential capacity curve. Accordingly, it is possible to delay the degradation of the battery and improve safety.

The effects of the present disclosure are not limited to the effects mentioned above, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" refers to a processing unit of at least one function or operation, and this may be implemented by hardware and software either alone or in combination.

In addition, throughout the specification, it will be further understood that when an element is referred to as being "connected to" another element, it can be directly connected to the other element or intervening elements may be present.

Figure 1:
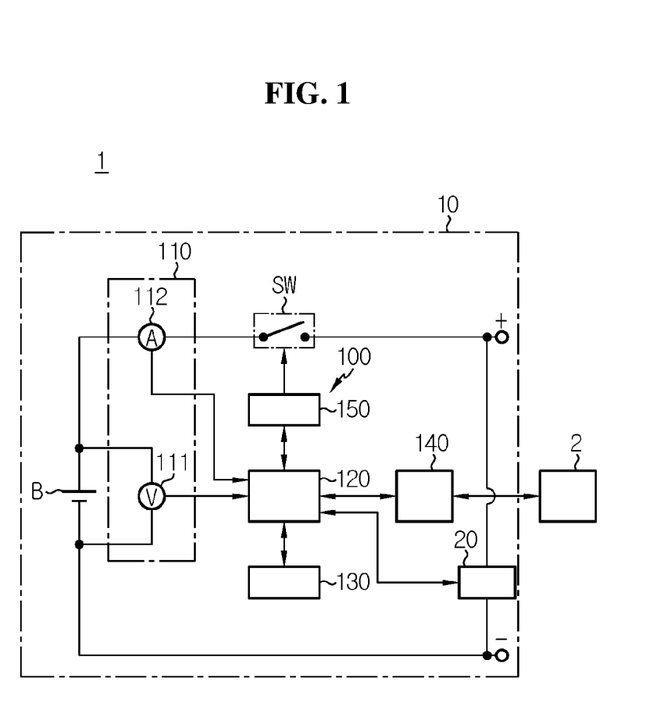
FIG. 1 is a diagram exemplarily showing an exemplary configuration of an electric vehicle according to the present disclosure.

FIG. 1 is a diagram exemplarily showing an exemplary configuration of an electric vehicle according to the present disclosure.

Referring to FIG. 1, a battery pack 10 is provided to be mountable on an electricity-powered device such as the electric vehicle 1. The battery pack 10 includes a battery B, a switch SW, a charging circuit 20 and a battery management system 100.

A positive terminal and a negative terminal of the battery B are electrically connected to the battery management system 100. The battery B is a lithium ion battery, and includes a positive electrode, a negative electrode and a separator. The separator is interposed between the positive electrode and the negative electrode to isolate the positive electrode from the negative electrode. A positive electrode active material may include lithium metal composite oxide, for example, $LiNi8/10Co1/10Mn1/10O2$. A negative electrode active material may include, for example, a carbon-based material (for example, graphite).

When a polarization phenomenon of the battery B is less than a predetermined level, a single phase change reaction of the positive electrode active material or the negative electrode active material occurs in a reference voltage range (for example, 3.6~3.8 V). The capacity of the battery B greatly changes on the basis of the voltage at which the phase change reaction occurs. Accordingly, after a differential capacity curve is obtained over the reference voltage range, the polarization level may be determined based on the feature point detection result with respect to the differential capacity curve. The polarization phenomenon may be simply referred to as 'polarization', and the extent of the polarization phenomenon may be referred to as 'polarization level'. Each feature point of the differential capacity curve may be used as information indicating the voltage at which the phase change reaction occurs.

The switch SW is installed on a current path connected in series to the battery B for the charge/discharge of the battery B. While the switch SW is turned on, the battery B can be charged and discharged. The switch SW may be a mechanical relay that is turned on/off by the electromagnetic force of a coil or a semiconductor switch such as a Metal Oxide Semiconductor Field Effect transistor (MOSFET). While the switch SW is turned off, the charge/discharge of the battery B is stopped. The switch SW may be turned on in response to a first switching signal (for example, a high level voltage). The switch SW may be turned off in response to a second switching signal (for example, a low level voltage).

The charging circuit 20 is electrically connected to the current path for the charge/discharge of the battery B. The charging circuit 20 is configured to convert the alternating current power from an external device (for example, a commercial power source) to the direct current power. The charging circuit 20 may include a constant current circuit to adjust a current rate (referred to as 'C-rate') for constant current charging according to a command from the battery management system 100.

The battery management system 100 is provided to protect the battery B from over-polarization. The battery management system 100 includes a sensing unit 110, a control unit 120 and a memory unit 130. The battery management system 100 may further include an interface unit 140. The battery management system 100 may further include a switch driver 150.

The sensing unit 110 includes a voltage sensor 111 and a current sensor 112. The voltage sensor 111 is connected in parallel to the battery B, and is configured to detect a voltage across the battery B and generate a voltage signal indicating the detected voltage. The current sensor 112 is connected in series to the battery B through the current path. The current sensor 112 is configured to detect a current flowing through the battery B, and generate a current signal indicating the detected current. The control unit 120 may collect sensing information including the voltage signal and the current signal in synchronization from the sensing unit 110.

The control unit 120 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing the other functions.

The control unit 120 is operably coupled to the charging circuit 20 and the sensing unit 110. The operably coupled refers to direct/indirect connection to enable signal transmission and reception in one or two directions. The control unit 120 is configured to perform an operation for protecting the battery B as described below.

When the voltage of the battery B is less than a lower limit voltage of the reference voltage range, the control unit 120 may transmit a charging start command to the charging circuit 20. The charging start command includes information indicating a current rate of a reference current. The charging circuit 20 performs constant current charging of the battery B with the reference current in response to the charging start command.

The control unit 120 is configured to determine the voltage, current, capacity and State-Of-Charge (SOC) of the battery B at a predetermined time interval based on the voltage signal and the current signal included in the sensing information at the predetermined time interval during constant current charging of the battery B. The SOC may be determined by at least one of a variety of well-known algorithms (for example, an ampere-hour integral method, a Kalman filtering method), and its detailed description is omitted.

The capacity of the battery B indicates the amount of electric charge stored in the battery B and may be referred to as 'residual capacity', and may be determined by current integration of the battery B at the predetermined time interval. The SOC of the battery B indicates a ratio of the capacity of the battery B to the maximum capacity (referred to as 'full charge capacity') of the battery B, and in general, it is indicated as 0~1 or 0~100%. The maximum capacity of the battery B gradually decreases as the battery B degrades.

A voltage history, a current history and a capacity history corresponding respectively to the voltage, current and capacity obtained at the predetermined time interval during constant current charging may be recorded in the memory unit 130 by the control unit 120. The capacity history is based on the current history. A history of a certain parameter refers to a time-series change of the corresponding parameter over a period of time.

The memory unit 130 is operably coupled to the control unit 120. The memory unit 130 may be also operably coupled to the sensing unit 110. The memory unit 130 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The memory unit 130 may store data and programs required for a computation operation by the control unit 120. The memory unit 130 may store data indicating the result of the computation operation by the control unit 120.

The interface unit 140 is configured to support wired or wireless communication between the control unit 120 and a high-level controller 2 (for example, ECU: Electronic Control Unit) of the electric vehicle 1. The wired communication may be, for example, controller area network (CAN) communication, and the wireless communication may be, for example, Zigbee or Bluetooth communication. The communication protocol is not limited to a particular type and may include any communication protocol that supports wired/wireless communication between the control unit 120 and the high-level controller 2. The interface unit 140 may include an output device (for example, a display, a speaker) to provide the information received from the control unit 120 and/or the high-level controller 2 in a recognizable format.

The switch driver 150 is electrically coupled to the control unit 120 and the switch SW. The switch driver 150 is configured to selectively output the first or second switching signal to the switch SW in response to the command from the control unit 120. The control unit 120 may command the switch driver 150 to turn on the switch SW during constant current charging of the battery B.

Figure 2:
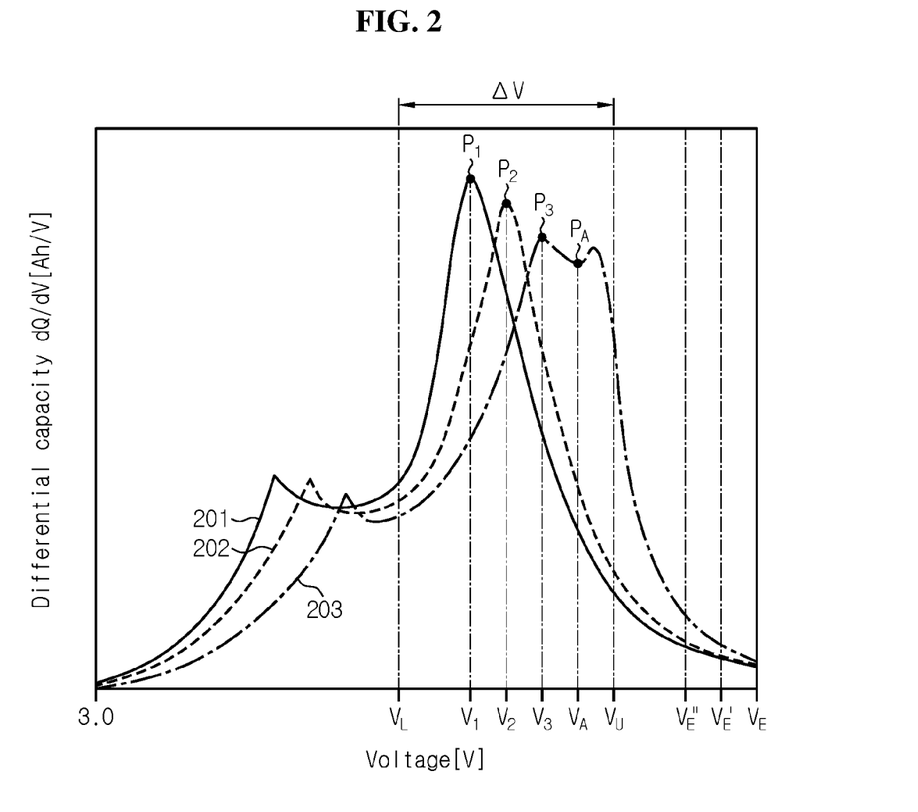
FIG. 2 is a graph showing an exemplary differential capacity curve over a voltage range including a reference voltage range.
Figure 3:
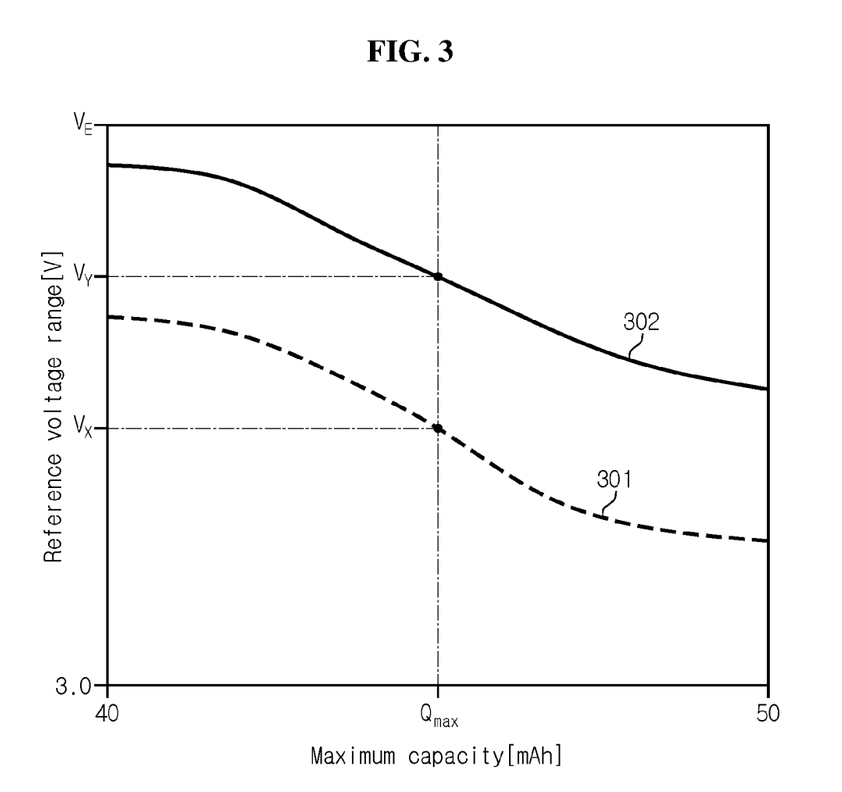
FIG. 3 is a graph showing an exemplary correlation between a maximum capacity of a battery and a reference voltage range.

FIG. 2 is a graph showing an exemplary differential capacity curve over the voltage range including the reference voltage range, and FIG. 3 is a graph showing an exemplary correlation between the maximum capacity of the battery and the reference voltage range.

Through experiments in which the polarization level is forced to increase during constant current charging, the inventors recognized the following fact. First, as the polarization level increases, the voltage at which the phase change reaction occurs gradually increases (i.e., shifted to higher voltage). Second, when the polarization level is increased more, the phase change reaction gradually occurs over a wide voltage range or the phase change reaction is split into separated voltage ranges.

In the specification, the differential capacity curve may refer to a dataset that records a correlation between the voltage of the battery B and a differential capacity. The differential capacity refers to a ratio dQ/dV of a capacity change dQ of the battery B to a voltage change dV of the battery B at the predetermined time interval.

In FIG. 2, VL and VU indicate the lower and upper limit voltages of the reference voltage range $\Delta V$, respectively, and VE indicates the cut-off voltage of constant current charging. Referring to FIG. 2, a first curve 201 indicates the differential capacity curve of the battery B free of polarization, a second curve 202 indicates the differential capacity curve when the polarization level of the battery B is less than the predetermined level, and a third curve 203 indicates the differential capacity curve when the polarization level of the battery B is equal to or larger than the predetermined level. In each of the curves 201, 202, 203, a feature point appearing in the reference voltage range $\Delta V$ for the first time may be referred to as a 'main feature point'. For example, the feature point refers collectively to at least one of a maximum point, a minimum point and an inflection point or a point satisfying a specific condition. In FIG. 2, the maximum point appearing in the reference voltage range $\Delta V$ for the first time in each of the curves 201, 202, 203 is shown as the main feature point.

The control unit 120 may detect the feature point appearing in the differential capacity curve at the predetermined time interval even before the voltage of the battery B reaches the upper limit voltage VU during constant current charging. Alternatively, the control unit 120 may simultaneously detect all the feature points appearing in the differential capacity curve over the reference voltage range $\Delta V$ after the voltage of the battery B reaches the upper limit voltage VU.

Describing the first curve 201, there is a single feature point P1 in the reference voltage range $\Delta V$. The memory unit 130 may pre-store the dataset corresponding to the first curve 201. The control unit 120 may set a reference voltage for determining the polarization level occurred in the battery B to be equal to a characteristic voltage V1 of the feature point P1.

Describing the second curve 202, there is a single feature point P2 in the reference voltage range $\Delta V$. It can be seen that a feature point P2 is shifted to higher voltage from the feature point P1. That is, a characteristic voltage V2 of the feature point P2 is higher than the characteristic voltage V1 of the feature point P1, and a voltage difference between the characteristic voltage V2 and the characteristic voltage V1 have a positive correlation with the polarization level occurred during constant current charging during which the second curve 202 is obtained.

The control unit 120 may perform a first protection operation based on the voltage difference between the characteristic voltage V2 and the characteristic voltage V1. The control unit 120 may perform the first protection operation from the time point at which the feature point P2 is detected.

The first protection operation may include an operation of decreasing the cut-off voltage of constant current charging by a compensation voltage corresponding to the voltage difference. The control unit 120 may determine the compensation voltage to be equal to the product of multiplying the voltage difference by a predetermined first weight.

Where the voltage difference=V2−V1=0.1 [V] and the first weight=0.9, VE=4.0 [V], the compensation voltage=0.09 [V], and the decreased cut-off voltage=VE−0.09 [V]=3.91 [V]=VE'. The control unit 120 may set the decreased cut-off voltage VE' as the cut-off voltage of constant current charging.

The first protection operation may include an operation of decreasing the reference current by the compensation current corresponding to the voltage difference. The control unit 120 may determine the compensation current to be equal to the product of multiplying the voltage difference by a predetermined second weight. Assume that the voltage difference=V2−V1=0.1 [V], the second weight=0.5 [C-rate/V] and the reference current=0.50 [C-rate], the compensation current=0.05 [C-rate], the decreased reference current=0.50−0.05 [C-rate]=0.45 [C-rate]. The control unit 120 may set the decreased reference current as the reference current of constant current charging.

Describing the third curve 203, there are two feature points P3, PA in the reference voltage range $\Delta V$. It can be seen that a feature point P3 is shifted to higher voltage from the feature point P1 than the feature point P2. That is, a characteristic voltage V3 of the feature point P3 is higher than the characteristic voltage V2 of the feature point P2, and a voltage difference between the characteristic voltage V3 and the characteristic voltage V1 indicates the polarization level occurred during constant current charging during which the third curve 203 is obtained.

The control unit 120 may perform the first protection operation based on the voltage difference between the characteristic voltage V3 and the characteristic voltage V1. The description of the first protection operation is in common with the description made with respect to the second curve 202. That is, the control unit 120 may decrease the cut-off voltage and/or the reference current as the first protection operation.

Assume that the third curve 203 is obtained after the second curve 202 is obtained. In the decrease of the cut-off voltage, the voltage difference=V3−V1=0.12 [V], the first weight=0.9, VE'=3.91 [V], the compensation voltage=0.108 [V], the decreased cut-off voltage=VE'−0.108 [V]=3.802 [V]=VE". The control unit 120 may set the decreased cut-off voltage VE" as the cut-off voltage of constant current charging. The lower limit of the cut-off voltage may be limited to the upper limit voltage VU. In the decrease of the reference current, where the voltage difference=V3−V1=0.12 [V], the second weight=0.5 [C-rate/V], the reference current=0.45 [C-rate], the compensation current=0.06 [C-rate], the decreased reference current=0.45−0.06 [C-rate]=0.39 [C-rate]. The control unit 120 may set the decreased reference current as the reference current of constant current charging.

The control unit 120 may monitor whether an additional feature point appears between the characteristic voltage V3 and the upper limit voltage VU at the predetermined time interval after the feature point P3 is detected. The control unit 120 may detect a point at which the slope of the third curve 203 is equal to or larger than a predetermined threshold or the minimum point of the third curve 203 as the additional feature point.

In FIG. 2, the minimum point PA appearing between the characteristic voltage V3 and the upper limit voltage VU for the first time is shown as being detected as the additional feature point. The additional feature point PA has a characteristic voltage VA between the characteristic voltage V3 and the upper limit voltage VU.

When the additional feature point PA is detected, the control unit 120 may perform a second protection operation. The control unit 120 may perform the second protection operation from the time point at which the additional feature point PA is detected.

The second protection operation may include an operation of additionally decreasing the reference current. Assume that the additional feature point PA is detected after the reference current is decreased from 0.45 [C-rate] to 0.39 [C-rate] by the first protection operation. In this case, the control unit 120 may set 0.351 [C-rate] obtained by multiplying the reference current 0.39 [C-rate] by a third weight (for example, 0.9) as the reference current of constant current charging.

The lower limit voltage VL and the upper limit voltage VU may be preset fixed values. Alternatively, the control unit 120 may determine the lower limit voltage VL and the upper limit voltage VU of the reference voltage range $\Delta V$ based on the maximum capacity QMAX of the battery B at the start of constant current charging. The maximum capacity QMAX may be determined as at least one of a variety of well-known algorithms, and its detailed description is omitted.

A relationship between the degree of degradation and the phase change reaction of the battery B is similar to a relationship between polarization and phase change reaction. Accordingly, to detect polarization occurred in the battery B from the differential voltage curve more accurately, it may be advantageous to determine the reference voltage range $\Delta V$ based on the maximum capacity corresponding to the degree of degradation of the battery B. Referring to FIG. 3, a curve 301 indicates a relationship between the maximum capacity and the lower limit voltage, and a curve 302 indicates a relationship between the maximum capacity and the upper limit voltage. The two curves 301, 302 of FIG. 3 may be prepared based on the results of experiment conducted on batteries manufactured with the same electrical and chemical performance as the battery B. The memory unit 130 may pre-store the dataset (for example, a lookup table) corresponding to the two curves 301, 302. For example, when the maximum capacity of the battery B is QMAX, the control unit 120 may set VX and VY associated with QMAX as a voltage VL and the upper limit voltage VU, respectively.

Figure 4:
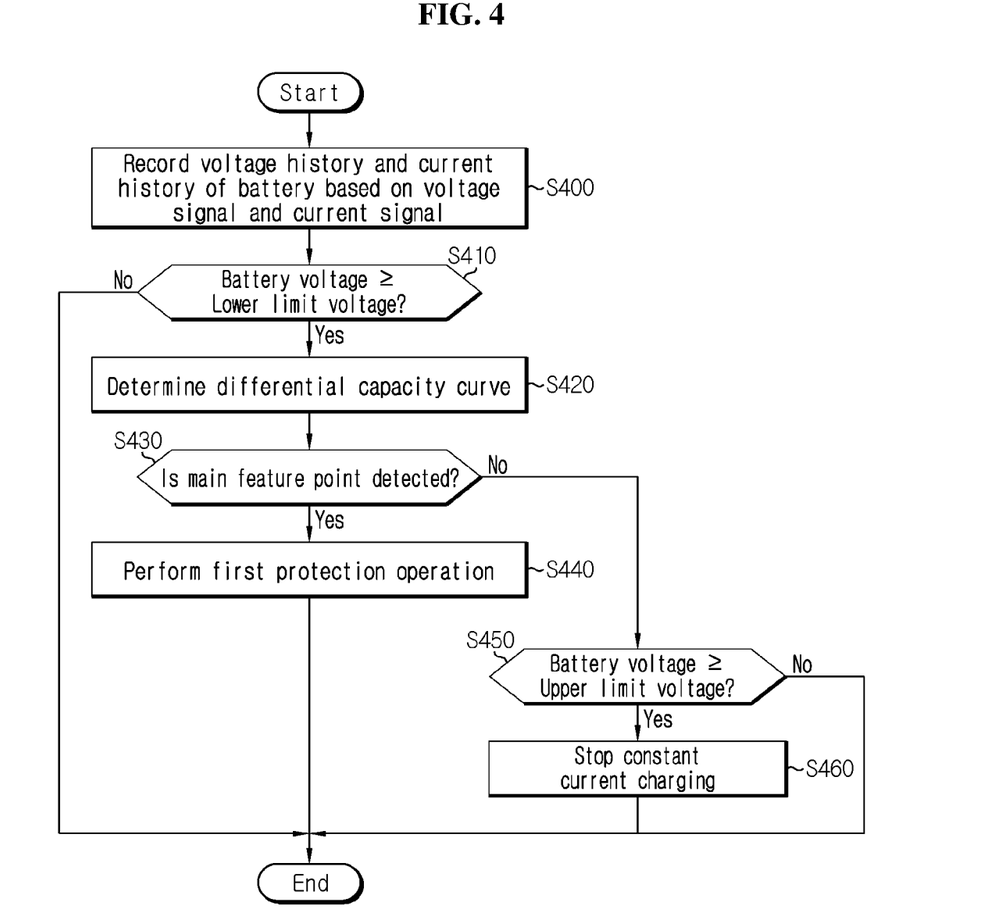
FIG. 4 is a flowchart exemplarily showing a battery management method according to a first embodiment of the present disclosure.
Figure 5:
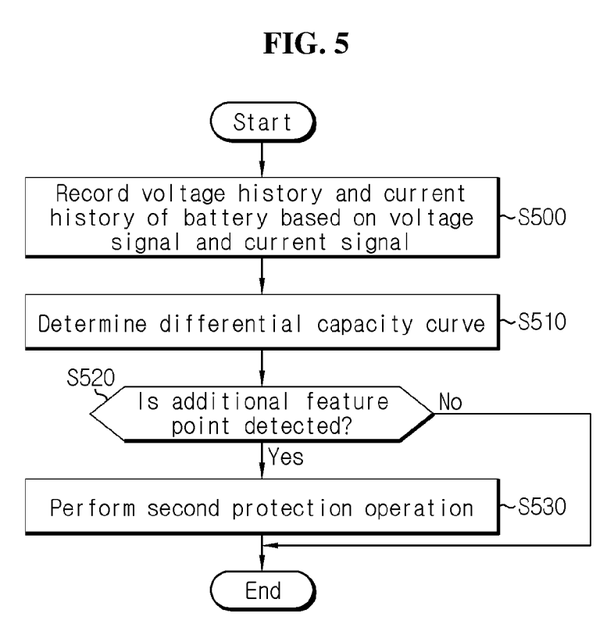
FIG. 5 is a flowchart exemplarily showing a battery management method according to a second embodiment of the present disclosure.

FIG. 4 is a flowchart exemplarily showing a battery management method according to a first embodiment of the present disclosure, and FIG. 5 is a flowchart exemplarily showing a battery management method according to a second embodiment of the present disclosure. For convenience of description, the methods of FIGS. 4 and 5 will be described on the basis of the third curve 203. The method of FIG. 4 may be repeated at the predetermined time interval until the main feature point P3 of the differential capacity curve 203 is detected or the voltage of the battery B reaches the upper limit voltage VU during constant current charging of the battery B. On the condition that the main feature point P3 is detected by the method of FIG. 4, the method of FIG. 5 may be repeated at the predetermined time interval until the additional feature point PA of the differential capacity curve 203 is detected, or the voltage of the battery B reaches the upper limit voltage VU.

Referring to FIGS. 1 to 4, in step S400, the control unit 120 records the voltage history and the current history of the battery B based on the voltage signal from the voltage sensor 111 and the current signal from the current sensor 112. That is, the voltage history and the current history are updated at the predetermined time interval.

In step S410, the control unit 120 determines whether the voltage of the battery B reached the lower limit voltage VL of the reference voltage range $\Delta V$. When a value of the step S410 is "Yes", step S420 is performed. When the value of the step S410 is "No", the method of FIG. 4 may end.

In step S420, the control unit 120 determines the differential capacity curve 203 indicating a correlation between the voltage of the battery B and the differential capacity based on the voltage history and the current history. That is, each time the step S420 is performed, the differential capacity curve 203 may be updated by voltage information and capacity information newly added for a predetermined time.

In step S430, the control unit 120 determines whether the main feature point P3 of the differential capacity curve 203 was detected. When a value of the step S430 is "Yes", step S440 is performed. When the value of the step S430 is "No", step S450 may be performed.

In step S440, the control unit 120 performs the first protection operation. The cut-off voltage or the reference current is decreased by the first protection operation. The control unit 120 may transmit a first charging current decrease command indicating the decreased reference current to the charging circuit 20. The charging circuit 20 may decrease the magnitude of the reference current in response to the first charging current decrease command.

In step S450, the control unit 120 determines whether the voltage of the battery B reached the upper limit voltage VU of the reference voltage range $\Delta V$. When a value of the step S450 is "Yes", step S460 may be performed. The value of the step S450 being "No" indicates that polarization is too severe to suppress or a failure occurred in the battery management system 100. When the value of the step S450 is "No", the method of FIG. 4 may end.

In step S460, the control unit 120 stops the constant current charging. That is, the control unit 120 transmits a charging stop command to the charging circuit 20. The charging circuit 20 may stop the supply of the reference current in response to the charging stop command. Alternatively or additionally, the control unit 120 may turn off the switch SW.

Referring to FIG. 5, in step S500, the control unit 120 records the voltage history and the current history of the battery B based on the voltage signal from the voltage sensor 111 and the current signal from the current sensor 112.

In step S510, the control unit 120 determines the differential capacity curve 203 indicating a correlation between the voltage of the battery B and the differential capacity based on the voltage history and the current history.

In step S520, the control unit 120 determines whether the additional feature point PA of the differential capacity curve 203 was detected. When a value of the step S520 is "Yes", step S530 is performed. When the value of the step S520 is "No", step S540 may be performed.

In step S530, the control unit 120 performs the second protection operation. The reference current may be additionally decreased by the second protection operation. The control unit 120 may transmit a second charging current decrease command indicating the additionally decreased reference current to the charging circuit 20. The charging circuit 20 may additionally decrease the magnitude of the reference of in response to the second charging current decrease command.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A battery management system, comprising:
    a voltage sensor configured to generate a voltage signal indicating a voltage of a battery;
    a current sensor configured to generate a current signal indicating a current flowing through the battery; and
    a control unit configured to record a voltage history and a current history of the battery based on the voltage signal and the current signal at a predetermined time interval during constant current charging of the battery,
    wherein the control unit is configured to:
    determine a differential capacity curve indicating a correlation between the voltage of the battery and a differential capacity in a reference voltage range based on the voltage history and the current history;
    detect a main feature point of the differential capacity curve; and
    in a first protection operation for the battery, compare a first characteristic voltage of the main feature point with a reference voltage.

2. The battery management system according to claim 1, wherein the main feature point is a first maximum point of the differential capacity curve during the constant current charging of the battery.

3. The battery management system according to claim 1, wherein the control unit is configured to set, in the first protection operation:
    a decreased cut-off voltage of the constant current charging, wherein the cut-off voltage is decreased by a compensation voltage corresponding to a voltage difference between the first characteristic voltage and the reference voltage, and
    a lower limit of the cut-off voltage to an upper limit voltage of the reference voltage range.

4. The battery management system according to claim 1, wherein the control unit is configured to set, in the first protection operation:
    a decreased reference current of the constant current charging, wherein the reference current is decreased by a first compensation current corresponding to a voltage difference between the first characteristic voltage and the reference voltage.

5. The battery management system according to claim 4, wherein the control unit is configured to:
    detect a second feature point from the different capacity curve, the second feature point having a second characteristic voltage that is larger than the first characteristic voltage; and
    perform a second protection operation for the battery in response to detection of the second feature point.

6. The battery management system according to claim 5, wherein the control unit is configured to additionally decrease, in the second protection operation, the reference current.

7. The battery management system according to claim 1, wherein the control unit is configured to stop the constant current charging in response to a feature point not being detected from the differential capacity curve.

8. The battery management system according to claim 1, wherein the control unit is configured to determine the reference voltage range based on a maximum capacity of the battery.

9. A battery pack comprising the battery management system according to claim 1.

10. An electric vehicle comprising the battery pack according to claim 9.

11. A battery management method performed at a predetermined time interval during constant current charging of a battery, the battery management method comprising:
    recording a voltage history and a current history of the battery based on a voltage signal indicating a voltage of the battery and a current signal indicating a current flowing through the battery;
    determining a differential capacity curve indicating a correlation between the voltage of the battery and a differential capacity in a reference voltage range based on the voltage history and the current history;
    detecting a main feature point of the differential capacity curve; and
    in a first protection operation for the battery, comparing a first characteristic voltage of the main feature point with a reference voltage.

12. The battery management method according to claim 11, further comprising:
    detecting a second feature point of the differential capacity curve, the second feature point having a second characteristic voltage that is larger than the first characteristic voltage; and
    performing a second protection operation for the battery in response to detecting the second feature point.

* * * * *